United States Patent
Tanaka et al.

(10) Patent No.: US 6,318,777 B1
(45) Date of Patent: Nov. 20, 2001

(54) SUCTION MECHANISM AND METHOD, FOR IC AND HORIZONTAL CONVEYER TYPE HANDLER

(75) Inventors: Hideyuki Tanaka; Kazumi Okamoto, both of Tokyo (JP)

(73) Assignee: Ando Electric Co., Ltd., Tokyo (JP)

( * ) Notice: Subject to any disclaimer, the term of this patent is extended or adjusted under 35 U.S.C. 154(b) by 0 days.

(21) Appl. No.: 09/417,300

(22) Filed: Oct. 13, 1999

(30) Foreign Application Priority Data

Oct. 13, 1998 (JP) .................................................. 10-291035

(51) Int. Cl.[7] .................................................. B25J 15/06
(52) U.S. Cl. .......................................... 294/64.1; 294/907
(58) Field of Search .............................. 294/2, 64.1, 64.2, 294/64.3, 65, 907; 29/743; 414/752.1; 901/40, 46

(56) References Cited

U.S. PATENT DOCUMENTS

| | | | |
|---|---|---|---|
| 4,557,514 | * 12/1985 | Cushman et al. | 294/64.1 |
| 5,207,465 | * 5/1993 | Rich | 294/64.1 |
| 5,231,753 | * 8/1993 | Tanaka et al. | 29/743 |
| 5,961,169 | * 10/1999 | Kalenian et al. | 294/64.1 |
| 6,000,122 | * 12/1999 | Uchida et al. | 29/743 |

FOREIGN PATENT DOCUMENTS

| | | | |
|---|---|---|---|
| 2087348 | * 5/1982 | (GB) | 294/64.1 |
| 6-39768 | * 2/1994 | (JP) | 294/64.1 |

* cited by examiner

Primary Examiner—Dean J. Kramer
(74) Attorney, Agent, or Firm—Oliff & Berridge, PLC

(57) ABSTRACT

A suction mechanism for an IC, in which a hollow shaft incorporating a suction pad at its lower end part is supported by a holder so as to be vertically slidable, and the suction pad is made into resilient contact with an IC accommodated in a recess on a tray when the holder is lowered. A stopper formed therein with a step part projected downward so as to laterally cover the suction pad is attached to the lower end part of the hollow shaft; the lower end of the step part is located above an IC contact surface of the suction pad, the lower surface of the stopper has at least a width with which the stopper is prevented from sinking into the recess on the tray, and a distance between the lower surface of the stopper to the IC contact surface of the suction pad is shorter than the depth of the recess on the tray.

18 Claims, 9 Drawing Sheets

SUCTION MECHANISM AND METHOD, FOR IC AND HORIZONTAL CONVEYER TYPE HANDLER

BACKGROUND OF THE INVENTION

1. Field of the Invention

The present invention relates to an IC suction mechanism and method, for sucking up an IC accommodated on a tray, and a horizontal conveyer type automatic handler incorporating the IC suction mechanism.

2. Description of Related Art

Explanation will be made of an IC suction mechanism according to an earlier development, with reference to FIGS. 7 to 12.

At first, the arrangement of a horizontal conveyer type automatic handler incorporating a suction mechanism (that is, a suction unit 2 in this example) for ICs.

Referring to FIG. 7 which is a plan view illustrating the arrangement of the horizontal conveyer type automatic handler, there are shown a supply part 1A, a preheat part 1B, a measuring part 1C, an accommodation part 1D, a supply hand 1E, an accommodation hand 1F, a loader 1G and an unloader 1H.

The horizontal conveyer type automatic handler 1 conveys an IC by horizontally shifting an IC carrier (which is not shown).

The supply hand 1E incorporates a plurality of supply suction units 2 (IC suction mechanisms) which will be explained later. The loader 1G carries a tray thereon in which a plurality of ICs 5 to be tested are accommodated. The unloader 1H carries thereon an empty tray.

Referring to FIG. 8, which is a perspective view illustrating a tray used in the loader 1G and the unloader 1H, a plurality of recesses 4a, e.g., in the example shown in FIG. 8, comprising a matrix of 4 lines and 5 rows, for accommodating the ICs 5 to be tested, are formed longitudinally and transversely on the tray 4.

Referring to FIG. 9 which is a perspective view illustrating an IC to be tested, an flat package IC 5 having a surface mounting shape is the object to be sorted by the horizontal conveyer type automatic handler.

Next, explanation will be made of the operation of the horizontal conveyer type automatic handler shown in FIG. 7.

The trays 4 which carry thereon the ICs 5 which have not yet been tested, are shifted onto the loader 1G by an operator. The supply hand 1E successively shifts the ICs from the topmost one of the trays 4 on the loader 1G onto the IC carrier located in the supply part 1A.

The IC carrier in which the ICs 5 are accommodated by a predetermined number is shifted from the supply part 1A to the preheat part 1B. When the ICs 5 are heated up to a predetermined temperature in the preheat part 1B, the IC carrier is shifted into the measuring part 1C.

After the ICs 5 are tested in the measuring part 1C, the IC carrier is shifted into the accommodation part 1D. The ICs 5 are sorted and shifted into a tray 4 on the unloader 1H by means of the accommodation hand 1F. The IC carrier which is emptied in the accommodation part 1F is returned to the supply part 1A.

Thus, the IC carrier is circulated in the automatic handler 1 through the supply part 1A, the preheat part 1B, the measuring part 1C, the accommodation part 1D and the supply part 1A in the mentioned order.

Next, an explanation will be made of an earlier developed IC suction mechanism (suction unit) with reference to FIGS. 10A and 10B.

Referring to FIGS. 10A and 10B which shows a suction unit as an example of the conventional IC suction mechanism, and in which FIG. 10A is a front view and FIG. 10B is a vertical sectional view, there are shown a suction unit 2, a suction pad 2A, a shaft 2B, a compression coil spring 2C, a direct acting bearing 2D, a holder 2E and a guide 2F.

In FIGS. 10A and 10B, the hollow conical shape suction pad 2A formed of elastic material such as rubber, is attached to the lower end part of the hollow shaft 2B. The cylindrical guide 2F is attached to the shaft 2B so as to cover the suction pad 2A. It is noted that with the provision of the guide 2F, there has been proved that the capability of suction can be enhanced.

The shank part of the shaft 2B is slidably held by the direct acting bearing 2D enclosed in the holder 2E. The compression spring 2C wound on the shank part of the shaft 2B is located between the guide 2F and the holder 2E so as to apply a force for separating the guide 2F and the holder 2E from each other. The shaft 2B is formed at its upper end part with a flange for limiting the motion of the shaft 2B.

The shaft 2B is attached thereon with a tube communicated with the hollow part thereof and having a distal end connected with a vacuum pump (suction means). That is, when the vacuum pump sucks up the air in such a condition that the suction pad 2A is made into contact with the IC 5, the IC5 is sucked up by the suction pad 2A.

Referring to FIGS. 10A and 10B, the suction unit 2 has such a structure that when the holder 2E is lowered so as to allow the suction pad 2A to make contact with the IC, and the suction pad 2A incorporating the suction unit 2A slides so as to absorb unevenness of thickness of packages of the ICs without application of excessive stress to the ICs 5.

Referring to FIG. 11 which shows such a condition that the ICs 5 accommodated on the tray 4 are sucked, the IC pad 2A is made into contact with the IC 5 and a gap C is defined between the upper surface of the holder 2E and the flange of the shaft 2B. In this condition, the IC 5 is sucked up as mentioned above.

FIG. 12 shows such a condition that no IC are accommodated on the tray 4. In FIG. 12, the holder 2E descends to the same position as that of FIG. 11. In this figure, because there are no IC 5 on the tray 4, the IC pad 2A is brought into contact with the bottom surface of the tray 4.

In the above-mentioned condition shown in FIG. 12, the horizontal conveyer type automatic handler 1 determines that the IC is sucked up, and accordingly, it tries to convey the tray 4 into the supply part 1A in this condition. However, the tray 4 is extremely heavy in comparison with the IC 5, the supply hand 1E cannot convey the tray 4 so that the suction is released. In this case, the horizontal conveyer type handler 1 determines that it drops the IC 5 so as to stop the operation at that time, indicating dropping of the IC 5.

The above-mentioned indication does mean that the suck-up of the IC is inferior. That is, it is erroneously recognized and determined that the supply hand 1E drops the IC5 during shifting.

SUMMARY OF THE INVENTION

The present invention was developed in order to solve the problems as mentioned above.

An object of the present invention is to provide an IC suction mechanism which can eliminate a defect such as erroneous recognition caused by such a matter that the tray is sucked up by the suction pad, and which can detect the presence of an IC on the tray.

Another object of the present invention is enhance the operational availability of a horizontal conveyer type automatic handler by applying the above-mentioned IC suction mechanism.

That is, in accordance with a first aspect of the present invention, the suction mechanism for an IC, in which a hollow shaft incorporating a suction pad at its lower end part, is supported by a holder so as to be vertically slidable, and the suction pad is made into resilient contact with an IC accommodated in a recess on a tray when the holder is lowered: wherein a stopper formed therein with a step part projected downward so as to laterally cover the suction pad is attached to the lower end part of the hollow shaft; the lower end of the step part is located above an IC contact surface of the suction pad, the lower surface of the stopper has at least a width with which the stopper is prevented from sinking into the recess on the tray, and a distance between the lower surface of the stopper to the IC contact surface of the suction pad is shorter than the depth of the recess on the tray.

According to the suction mechanism, because the stopper formed therein with a step part projected downward so as to laterally cover the suction pad is attached to the lower end part of the hollow shaft; the lower end of the step part is located above an IC contact surface of the suction pad, the lower surface of the stopper has at least a width with which the stopper is prevented from sinking into the recess on the tray, and a distance between the lower surface of the stopper to the IC contact surface of the suction pad is shorter than the depth of the recess on the tray, when the holder is lowered in such a condition that an IC exists in the recess on the tray, the suction pad makes contact with the IC but does not make contact with the upper surface of the tray, and when the holder is lowered in such a condition that no IC exist in the recess on the tray, the lower surface of the stopper is made into contact with the upper surface of the tray so that the suction pad has a gap between the bottom surface of the recess on the tray.

Therefore, when the holder is lowered in such a condition that no IC exist in the recess on the tray, the tray is not sucked by the suction pad.

Thus, it is possible to eliminate a defect such as erroneous recognition caused by suck-up of the tray by the suction pad.

In accordance with a second aspect of the present invention, the suction mechanism for an IC, in which a hollow shaft incorporating a suction pad at its lower end part, is supported by a holder so as to be vertically slidable, and the suction pad is made into resilient contact with an IC accommodated in a recess on a tray when the holder is lowered: wherein a stopper formed therein with a step part projected downward so as to laterally cover the suction pad is attached to the lower end part of the hollow shaft; the suction pad is made into contact with the IC but the lower surface of the stopper is not made into contact with the upper surface of the tray, when the holder is lowered in such a condition that an IC exists in the recess on the tray, and the lower surface of the stopper makes contact with the upper surface of the tray so that the suction pad defines a gap with respect to the bottom surface of the recess on the tray when the holder is lowered in such a condition that no IC exist in the recess.

According to the suction mechanism having such a structure, because the stopper formed therein with a step part projected downward so as to laterally cover the suction pad is attached to the lower end part of the hollow shaft; the suction pad is made into contact with the IC but the lower surface of the stopper is not made into contact with the upper surface of the tray, when the holder is lowered in such a condition that an IC exists in the recess on the tray, and the lower surface of the stopper makes contact with the upper surface of the tray so that the suction pad defines a gap with respect to the bottom surface of the recess on the tray when the holder is lowered in such a condition that no IC exist in the recess on the tray, it is possible to prevent the suction pad from sucking the tray when the holder is lowered in such a condition that no IC exist in the recess on the tray.

Consequently, it is possible to delete the problem of erroneous recognition and the like which are caused by sucking the tray by the suction pad.

In accordance with a third aspect of the present invention, the suction mechanism for an IC, in which a hollow shaft incorporating a suction pad at its lower end part, is supported by a holder so as to be vertically slidable, and the suction pad is made into resilient contact with an IC accommodated in a recess on a tray when the holder is lowered: wherein the hollow shaft is attached thereto with a stopper which makes contact with the upper end face of the tray so as to lock downward slide motion of the hollow shaft when the holder is lowered in such a condition no IC exist in the recess on the tray, in order to prevent the suction pad from being made into contact with the bottom surface of the recess on the tray.

According to the suction mechanism having such a structure, because the hollow shaft is attached thereto with a stopper which makes contact with the upper end face of the tray so as to lock downward slide motion of the hollow shaft when the holder is lowered in such a condition no IC exist in the recess on the tray, in order to prevent the suction pad from being made into contact with the bottom surface of the recess on the tray, it is possible to prevent the suction pad from making contact with the bottom surface of the recess on the tray even though the holder is lowered in such a condition that no IC exist in the recess on the tray.

Accordingly, it is possible to prevent the suction pad from sucking the tray, and accordingly, such a defect such as erroneous recognition caused by such a matter that the suction pad sucks the tray.

In the above first to third aspects of the invention, the IC suction mechanism may further comprise: a suction means which can suck up an IC toward the suction pad in such a condition that the IC is made into contact with the suction pad, a pressure sensor for detecting a high or lower degree of pneumatic pressure in a suction passage in the suction means, and an IC detecting means for detecting the presence of an IC in the recess on the tray on a basis of detection of the pressure sensor.

According to the IC suction mechanism having such a structure, the pressure sensor detects a high or lower pneumatic pressure in the suction passage in the suction means, and the IC detecting means detects the presence of the IC in the recess on the tray on the basis of the result of the detection by the pressure sensor.

In the first to third aspects of the invention, ICs accommodated on the tray may be successively shifted into an IC conveyer therefrom.

In accordance with a fourth aspect of the present invention, the horizontally conveyer type automatic handler comprises a suction mechanism for an IC according to any one of the first to third aspects of the present invention.

According to such a horizontally conveyer type automatic handler, since the horizontally conveyer type automatic handler comprises a suction mechanism for an IC according to any one of the first to third aspects, such a defect as erroneous recognition such that the tray would be an IC in the IC suction mechanism can be reduced, thereby it is possible to enhance the operational availability of the horizontal conveyer type automatic handler.

In accordance with a fifth aspect of the present invention, the suction method for sucking up an IC accommodated in a recess on a tray, by descending a suction pad attached to a hollow shaft which is vertically movable, to the IC accommodated in the recess and by sucking the IC by vacuum, comprises: a first descending step for descending the hollow shaft to bring the suction pad into contact with an IC accommodated in the recess when the IC exists in the recess, and a preventing step for preventing the suction pad from bring into contact with a bottom surface of the recess of the tray by a portion of the hollow shaft being brought into contact with an upper surface of the tray when no IC exist in the recess.

According to the suction method, when the holder is lowered in such a condition that no IC exist in the recess on the tray, the tray is not sucked by the suction pad. Therefore, it is possible to eliminate the above-described defect such as erroneous recognition caused by suck-up of the tray by the suction pad.

BRIEF DESCRIPTION OF THE DRAWINGS

The present invention will become more fully understood from the detailed description given hereinbelow and the accompanying drawings which are given by way of illustration only, and thus are not intended as a definition of the limits of the present invention, and wherein;

FIGS. 1A and 1B show a suction unit including the IC suction mechanism according to a first embodiment of the present invention, in which FIG. 1A is a front view thereof, and FIG. 1B is a vertical sectional view;

FIGS. 5A to 5C are vertical sectional views which show a suction mechanism including the IC suction mechanism according to a second embodiment of the present invention, and which show state changes in such a case that an IC is accommodated in a recess on a tray, and in which FIG. 5A shows such a condition that the suction unit is shifted to a position above the IC accommodated in the recess on the tray, and FIG. 5B shows such a condition that the suction unit is lowered from the position shown in FIG. 5A, and FIG. 5C shows such a condition that the suction unit sucking up the IC ascends from the position shown in FIG. 5B;

FIGS. 6A to 6C are vertical sectional views of FIGS. 5A to 5C, which show stage changes in such a case no IC exist in the recess on the tray, and in which FIG. 6A shows such a condition that the suction unit is shifted to a position above the recess on the tray, FIG. 6B shows such a condition that the suction unit descends from the position shown in FIG. 6A, and FIG. 6C shows such a condition that the suction unit ascends from the position shown in FIG. 6B;

FIGS. 10A and 10B show suction unit including an IC suction mechanism according to an earlier development, in which FIG. 10A is a front view thereof and FIG. 10B is a vertical sectional view thereof;

PREFERRED EMBODIMENT OF THE INVENTION

An explanation for embodiments of the present invention will be carried out with reference to FIGS. 1 to 6.

First Embodiment

Figure 1A:
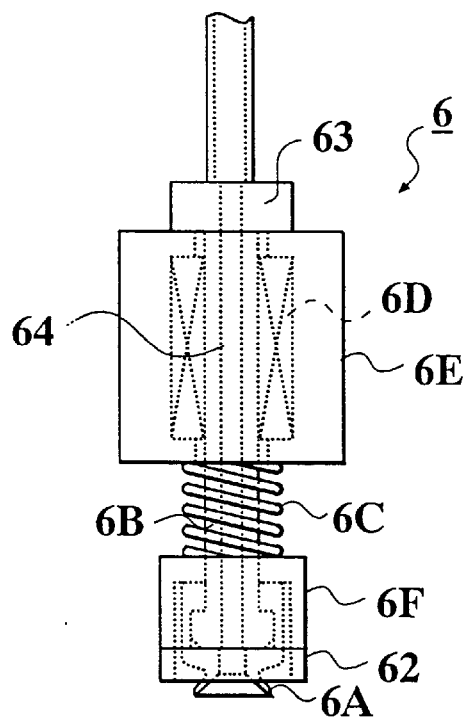
Figure 1B:
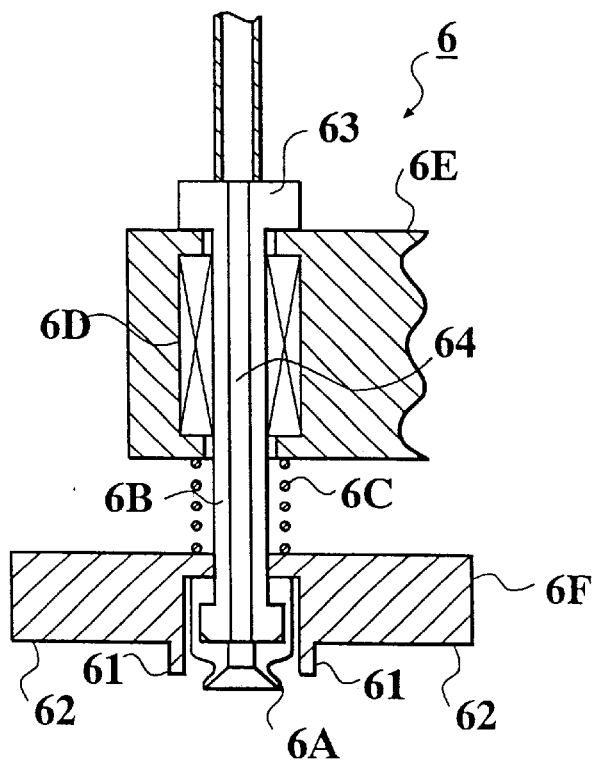

FIGS. 1A and 1B show a suction unit as an example of an IC suction mechanism in a first embodiment according to the present invention, in which FIG. 1A is a front view and FIG. 1B is a vertical sectional view.

Referring to FIGS. 1A and 1B, there are shown a suction unit (IC suction mechanism) 6, a suction pad 6A, a shaft (hollow shaft) 6B, a compression coil spring 6C, a direct acting bearing 6D, a holder 6E and the stopper 6F.

Figure 7:
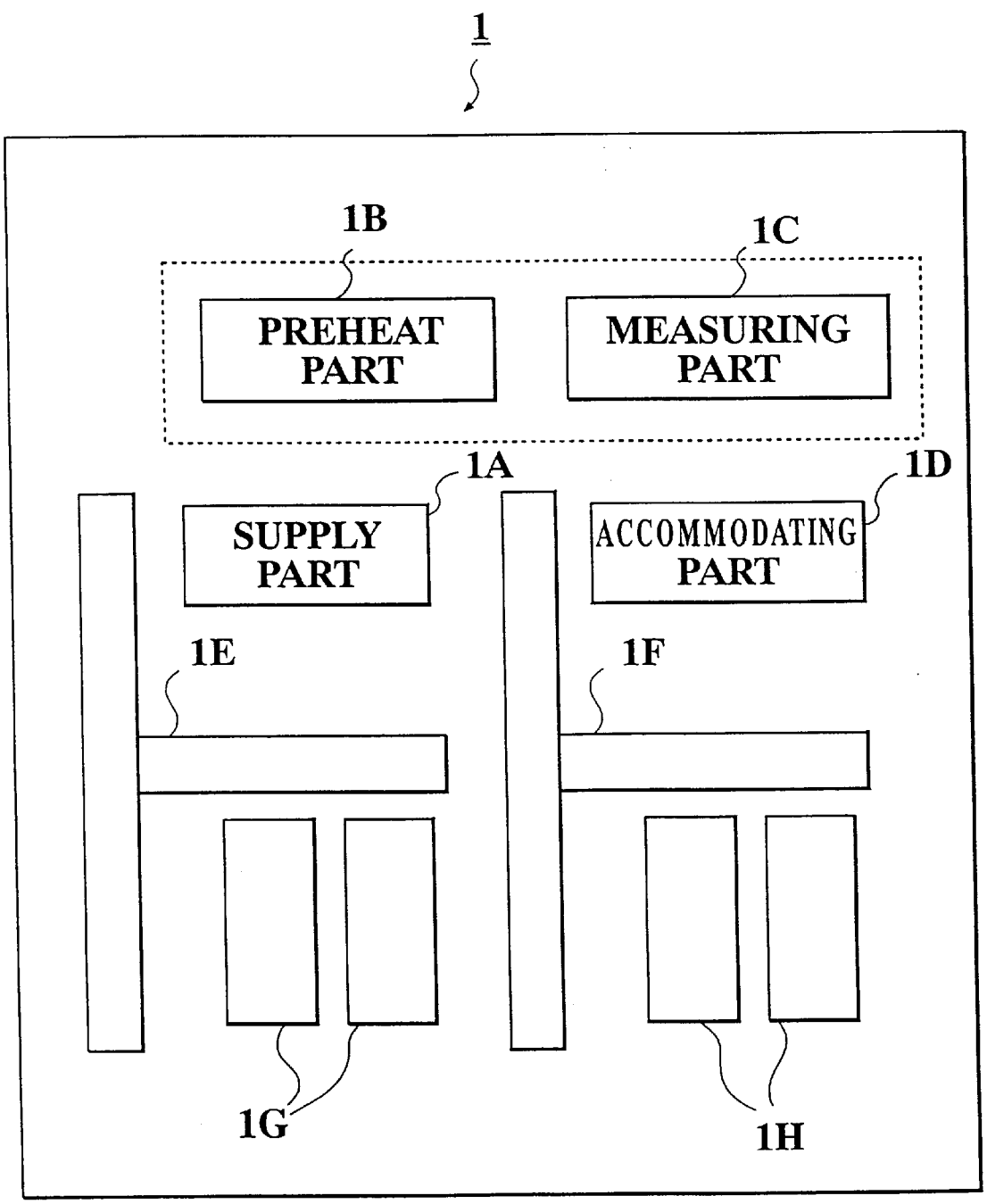
FIG. 7 is a plan view illustrating an arrangement of a horizontal conveyer type handler.
Figure 8:
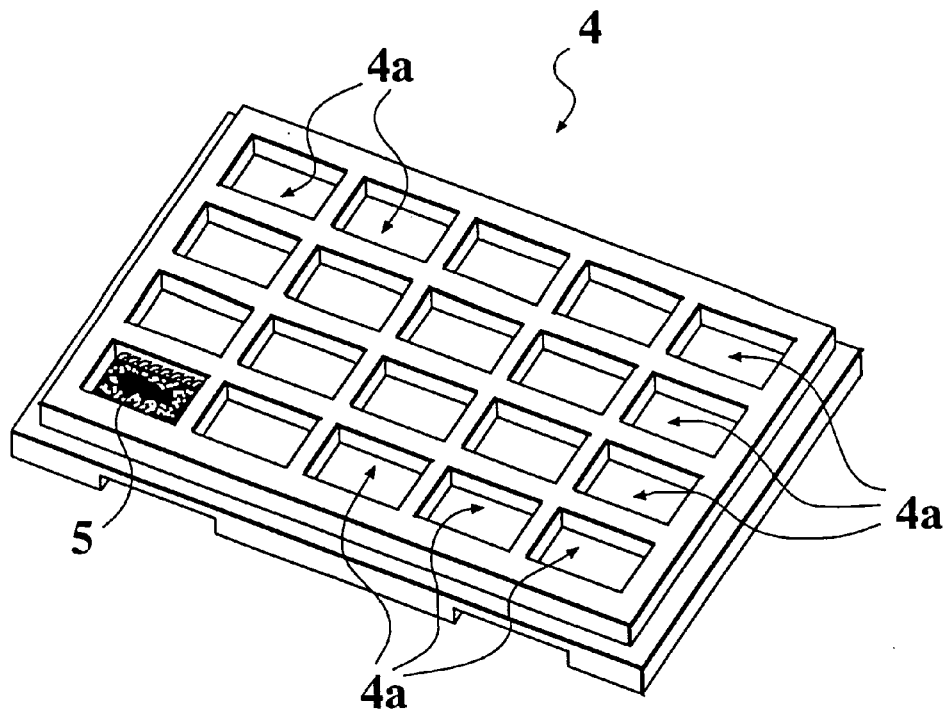
FIG. 8 is a perspective view illustrating a tray used in the horizontal conveyer type handler shown in FIG. 7.
Figure 9:
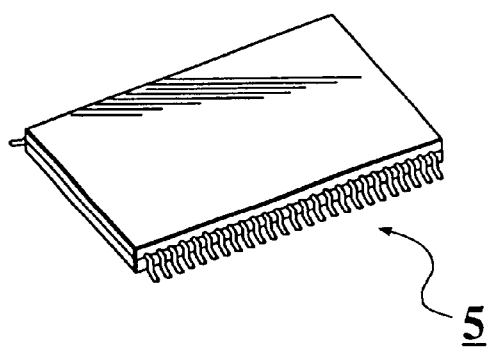
FIG. 9 is an external view illustrating an IC to be tested by the horizontal conveyer type handler.
Figure 10A:
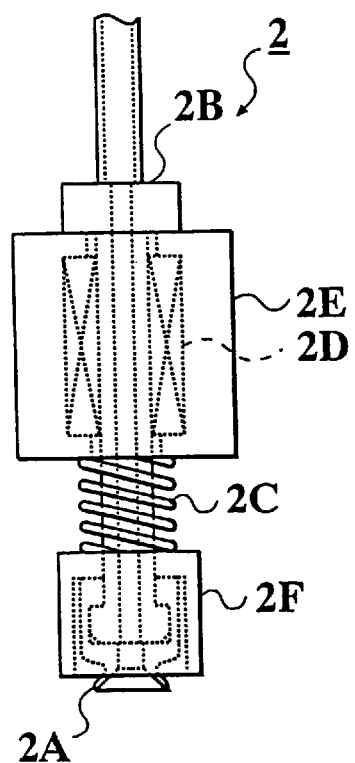
Figure 10B:
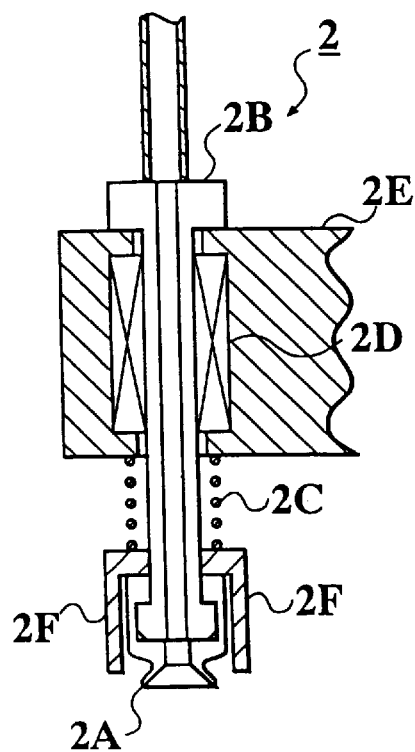
Figure 11:
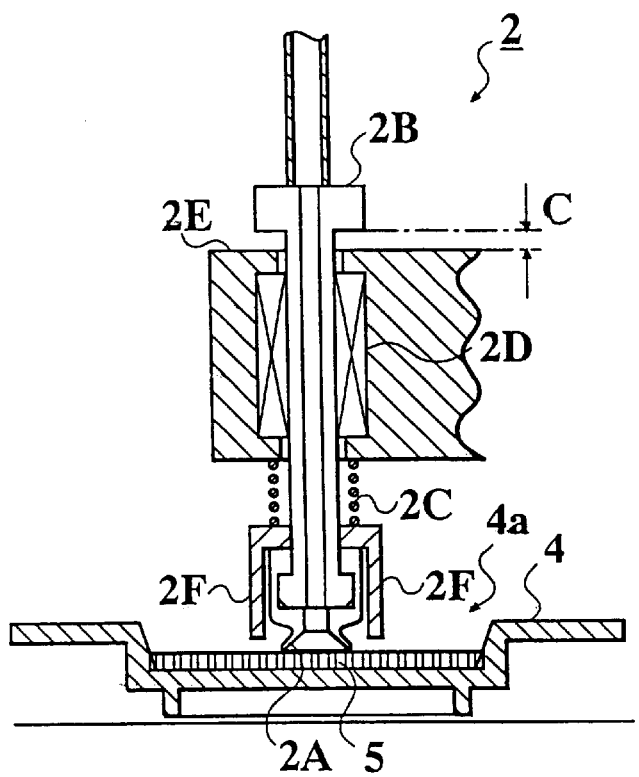
FIG. 11 is a vertical sectional view illustrating the suction unit shown in FIG. 10 in such a condition that the IC accommodated on the tray is sucked.
Figure 12:
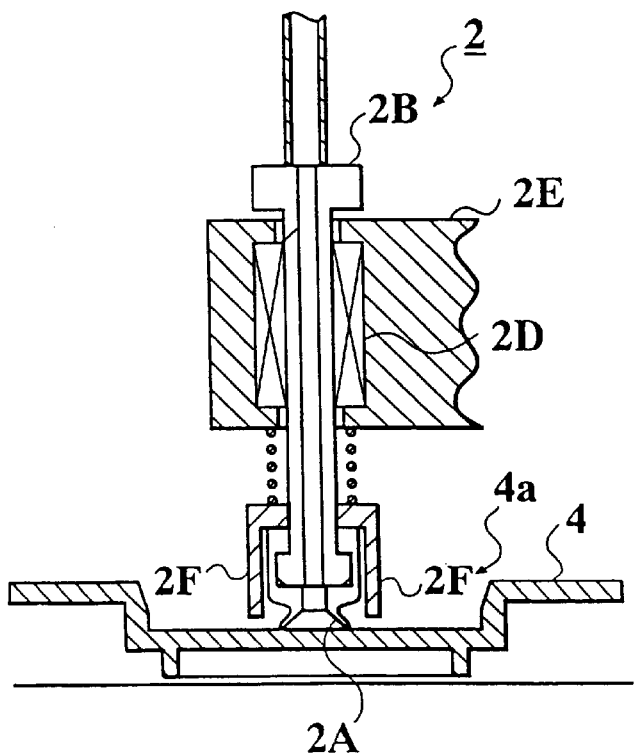
FIG. 12 is a vertical sectional view illustrating the suction unit shown in FIG. 10 in which no IC is accommodated on the tray.

The suction unit 6 exemplified as the IC suction mechanism in the first embodiment according to the present invention, is incorporated in the supply hand 1E of the horizontal conveyer type automatic handler 1 shown in FIG. 7 as mentioned above.

In FIGS. 1A and 1B, the hollow conical suction pad 6A made of an elastic material such as rubber is attached to the lower end part of the hollow shaft 6B. The stopper 6F having a step part 61 projected downward so as to laterally cover the suction pad 6A, is attached to the lower end part of the shaft 6B.

The shank part of the shaft 6B is slidably held by the direct acting bearing 6D enclosed in the holder 6E. The compression coil spring 6C wound on the shank part of the shaft 6B is interposed between the stopper 6F and the holder 6E, and applies a force for separating the stopper 6F and the holder 6E from each other. A flange is formed on the upper end part of the shaft 6B so as to limit the motion of the shaft 6B.

Further, the lower surface 62 of the stopper 6F has at least a width with which it is prevented from sinking into the recess 4a (refer to FIGS. 3 and 4) on the tray 4, and the distance between the lower surface 62 of the stopper and the sucking surface (IC contact surface) of the suction pad 6A is shorter than the depth of the recess 4a on the tray 4.

Further, the lower end of the step part 61 of the stopper 6F is located above the suction surface (IC contact surface) of the suction pad 6A, and accordingly, the step part 61 is prevented from making contact with the IC 5.

A tube (which is not shown) communicated with the hollow part 64 of the shaft 6B is attached to the shaft 6B, having its distal end which is connected with a vacuum pump exemplified as a suction means. That is, in a condition in which the suction pad 6A is made into contact with the IC 5, the vacuum pump sucks up air, and accordingly, the IC 5 is sucked up by the suction pad 16A.

Figure 2:
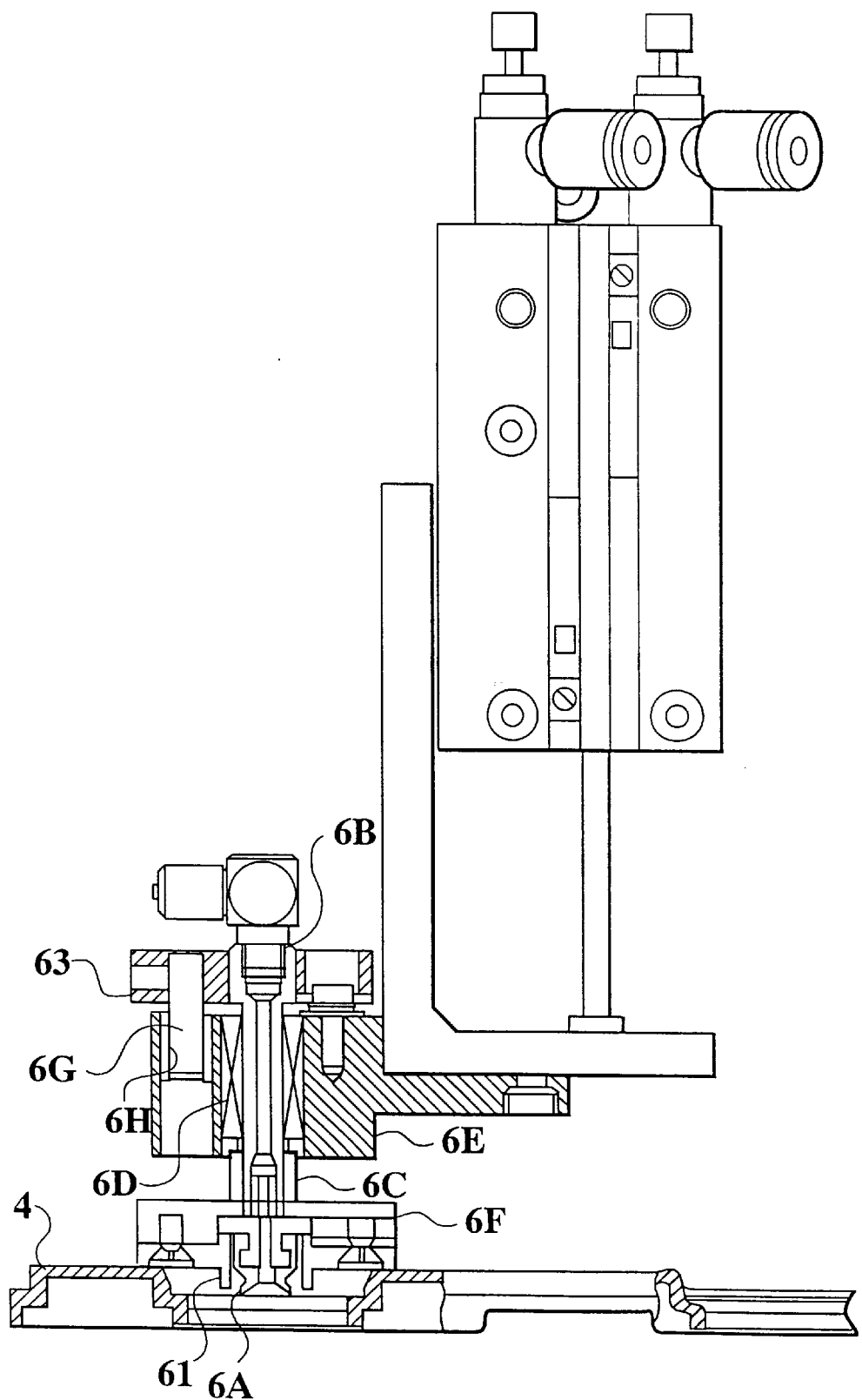
FIG. 2 is a partially vertical sectional view illustrating an IC suction mechanism according to a deformed example of the first embodiment.

FIG. 2 is a partially vertical sectional view illustrating an IC suction mechanism according to a deformed example of the first embodiment shown in FIG. 1.

Referring to FIG. 2, in order to prevent rotation of the stopper 6F, a pin 6G is provided in the flange 63 of the shaft 6B, being extended downward, and a through-hole 6H which receives the pin 6G is formed in the holder 6E. It is noted that the explanation which will be described hereinbelow will be made with reference to the principle arrangement shown in FIG. 1.

The operation of the suction unit 6 in this embodiment will be explained with reference to FIGS. 3 and 4.

Figure 3:
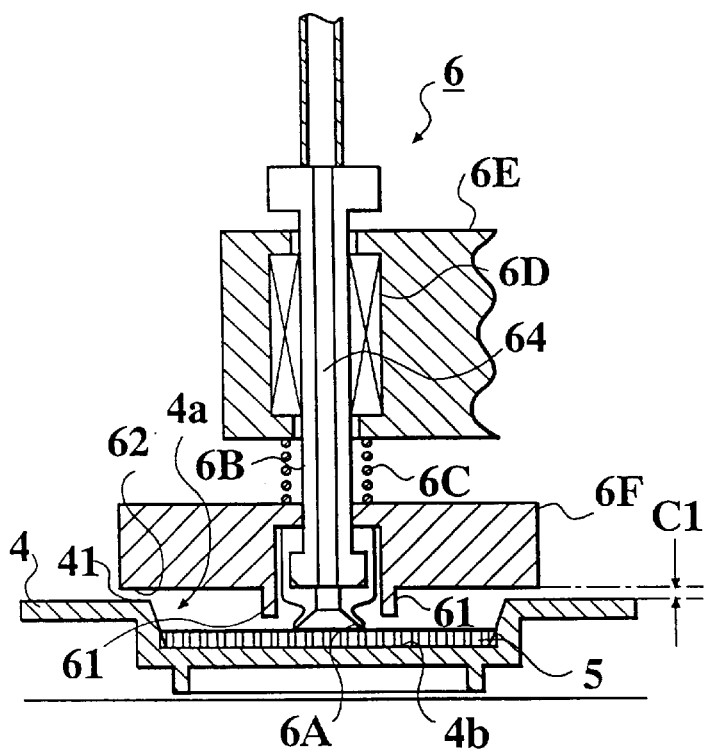
FIG. 3 is a vertical sectional view which shows the suction unit shown in FIG. 1 in such a case that an IC is accommodated in a recess on a tray.
Figure 4:
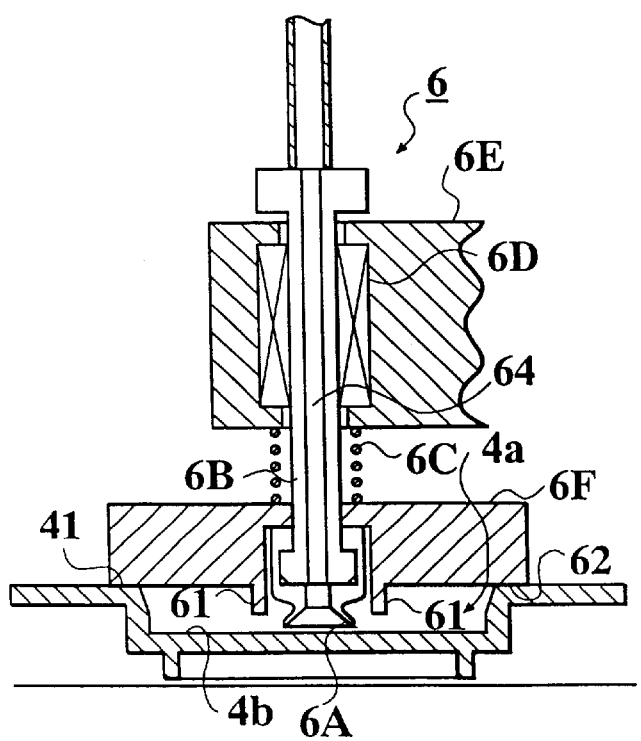
FIG. 4 is a vertical sectional view which shows the suction unit shown in FIG. 1 in such a case no IC exist in the recess on the tray.

Referring to FIGS. 3 and 4 which are vertical sectional views illustrating the suction unit 6 shown in FIGS. 1A and 1B, FIG. 3 illustrates such a case that the IC 5 is accommodated in the recess 4a on the tray 4, and FIG. 4 illustrates such a case that no IC 5 exist in the recess 4a on-the tray 4.

When the holder 6E is lowered in such a condition that the IC 5 exists in the recess 4a on the tray 4, the suction pad 6A makes contact with the IC 5 as shown in FIG. 3.

At this time, the shaft 6B absorbs stress exerted to the IC 5, and slides upward, overcoming the urging force of the compression coil spring 6, in order to absorb unevenness in the package thickness of ICs 5.

Further, a gap C1 (for example, about 1.5 mm) is defined between the lower surface 62 of the stopper 6F and the upper surface 41 of the tray 4

In this condition, the vacuum pump starts its suction so that the IC 5 is sucked up by the suction pad 6A.

Meanwhile, when the holder 6E is lowered in such a condition that no IC 5 exist in the recess 4a on the tray 4, the lower surface 62 of the stopper 6F makes contact with the upper surface 41 of the tray 4, a gap is defined between the suction pad 6A and the bottom surface 4a of the suction pad 6A.

At this time, since the suction pad 6A is opened without making contact with the bottom surface 4b of the recess 4a, the suction pad 6A does not suck up the tray 4 even though the vacuum pump effects suction.

Accordingly, the suction unit 6 in this embodiment can eliminate a defect such as erroneous determination caused by such a matter that the suction pad 6 sucks up the tray 4.

It is noted that the shape, the material and the attaching position and the like of the stopper 6F should not be limited to specific matters if there may be obtained such an arrangement that the stopper 6F makes contact with the upper surface 41 of the tray 4 so that the shaft 6B is moved upward, and accordingly, the suction pad 6A can be prevented from making contact with the upper surface 41 of the tray 4 when the holder 6E is lowered in such a condition that no IC exist in the recess 4a on the tray 4.

Second Embodiment

A second embodiment of the present invention will be explained with reference to FIGS. 5A–5C and 6A–6C.

The second embodiment is similar to the first embodiment except those peculiar to the second embodiment.

In the second embodiment, the same reference numerals are used to denote the same elements as those in the first embodiment so as to omit explanation thereof.

A suction unit 16 exemplified as the IC suction mechanism in the second embodiment, has such an arrangement that a pressure sensor for detecting a high and a low pneumatic pressure in a suction passage (for example the hollow part 64 of the shaft 6B, and the tube) for the vacuum pump (suction means) and an IC detecting means for detecting the presence of the IC 5 in the recess 4a of the tray 4 on the basis of the detection of the pressure sensor, are provided in the suction unit 6 explained in the first embodiment.

The pressure sensor is located at a position at which an pneumatic pressure in the above-mentioned passage in the vacuum pump can be detected. Further, the pressure sensors delivers a result of its detection to the IC detecting means.

Figure 5A:
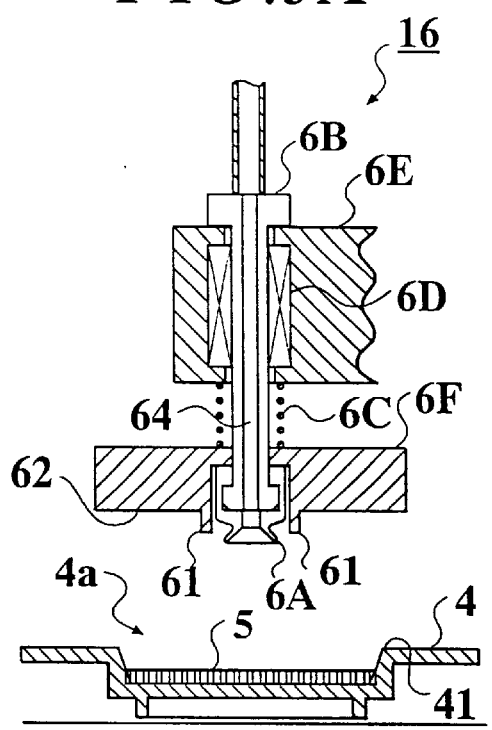
Figure 5B:
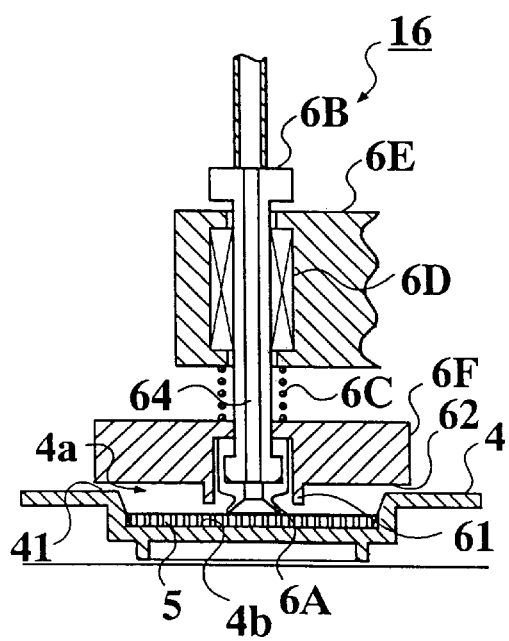
Figure 5C:
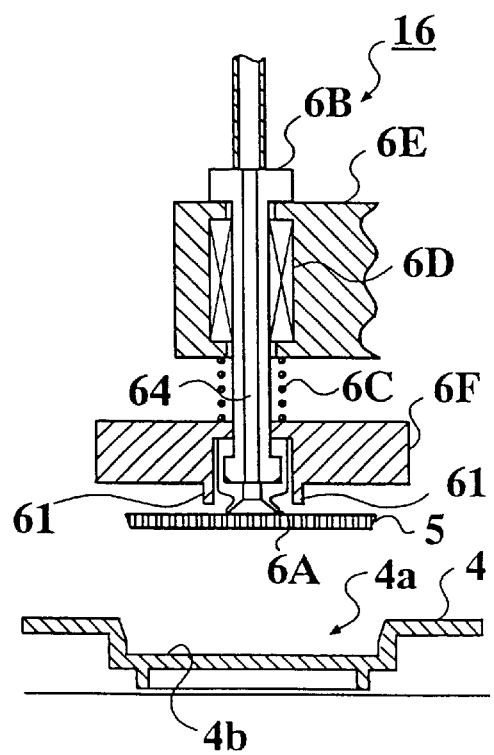

FIGS. 5A–5C are views showing state changes of the suction unit in such a case that the IC 5 is accommodated in the recess 4a on the tray 4.

FIG. 5A shows a condition in which the suction unit 16 is shifted to a position above the IC 5 accommodated in the recess 4a on the tray 4.

FIG. 5B shows a condition in which the suction unit 6 is lowered by an elevating mechanism which is not shown from the condition shown in FIG. 5A.

Referring to FIG. 5A, the suction pad 6A makes contact with the IC 5 in the recess 4a on the tray 4a, and then, the IC 5 is sucked to the suction pad 6A through the suction of the vacuum pump. At this time, a gap is defined between the lower surface of the stopper 6F and the upper surface 41 of the tray.

The suction unit 16 having sucked the IC 5 ascends from the condition shown in FIG. 5B so as to effect a condition shown in FIG. 5C. From the condition shown in FIG. 5C, the suction unit 16 conveys the IC 5 into the supply part 1A which is shown in FIG. 7.

Referring to FIG. 6 which a view showing stage changes of the suction unit 16 in such a case that no IC 5 exist in the recess 4a on the tray 4.

Figure 6A:
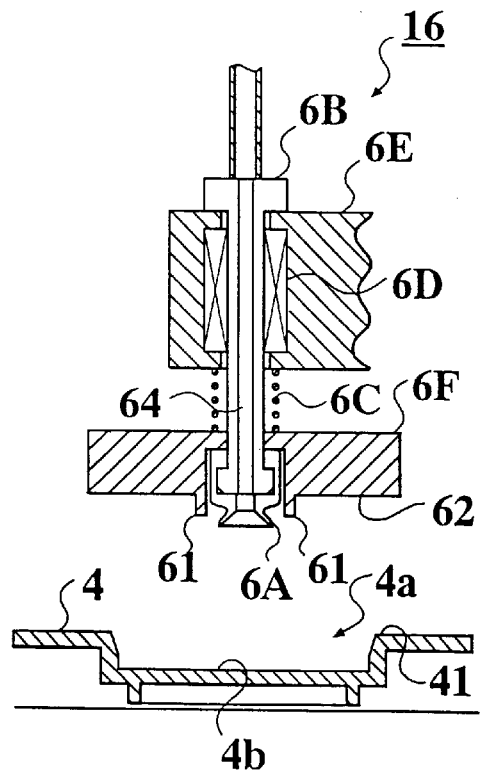

FIG. 6A shows a condition in which the suction unit 16 is shifted to a position above the recess 4a on the tray 4.

Figure 6B:
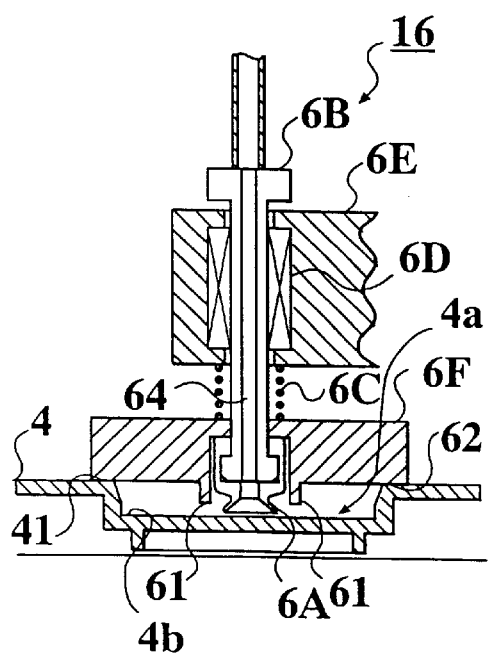

FIG. 6B shows a condition in which the suction unit is lowered by the elevating mechanism which is not shown, from the condition shown in FIG. 6A.

In the condition shown in FIG. 6B, the lower surface 62 of the stopper 6F makes contact with the upper surface 41 of the tray 4 so that a gap is defined between the suction surface (IC contact surface) 62 of the stopper 6F and the bottom surface 4b of the tray 4. Accordingly, even though the suction pump sucks up, the suction pad 6A cannot suck up the tray 4.

Figure 6C:
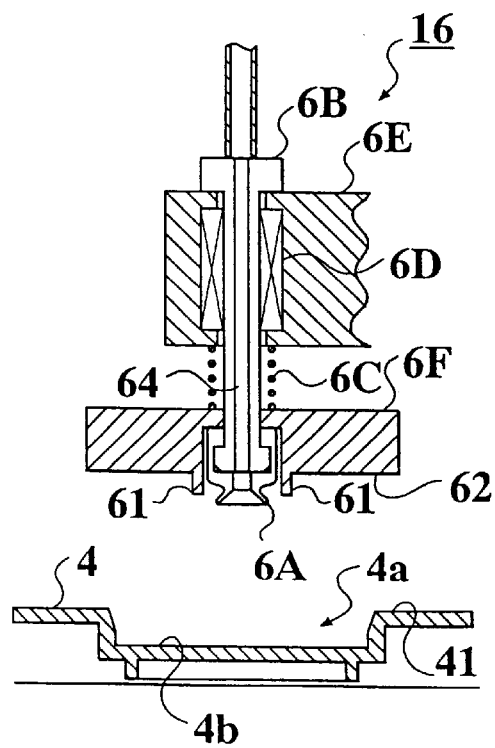

The suction unit 16 ascends from the condition shown in FIG. 6B so as to effect a condition shown in FIG. 6C.

Thereafter, the suction unit 16 is shifted to a position above a recess 4a located at a different position, then above-mentioned operation is repeated.

As mentioned above, in a condition in which the suction unit 16 is lowered, when the IC 5 exists on the tray 4, the suction surface (IC contact surface) of the suction pad 6A is made into close contact with the upper end surface of the IC 5 so that the suction passage (the hollow part of the shaft 6B and the inside of the tube) for the vacuum pump is tightly closed. Meanwhile, when no IC 5 exist on the tray 4, a gap is defined between the suction surface of the suction pad 16 and the bottom surface 4b of the recess 4a on the tray 4 so that the suction passage for the vacuum pump is opened. Thus, in comparison of the case where the IC 5 exists on the tray 4 with the case where no IC 5 exist therein, the pneumatic pressure in the suction passage for the vacuum pump differs.

Thus, the IC detecting means can determine the presence of the IC 5 in the recess 4a on the tray on the basis of a high or lower pneumatic pressure in the suction passage for the vacuum pump, which is detected by the pressure sensor.

It is noted that in this embodiment, although the stopper 6F is provided in the suction unit 16 so as to open the suction passage for the vacuum pump in such a case that no IC 5 exist in the recess 4a on the tray 4, the suction passage may be opened with the provision of a through-hole in the recess 4a on the tray 4. However, the provision of the through-hole in the recess 4a on the tray 4 is unpractical since trays to be used have to be limited.

Moreover, detailed structures or the like specifically explained in the above-mentioned embodiments may be suitably modified without departing the concept of the present invention.

According to the present invention, when the holder is lowered in such a condition that no IC exist in the recess on the tray, the stopper attached to the hollow shaft makes contact with the upper end surface of the tray so as to lock the downward slide of the hollow shaft in order to prevent the suction pad from making contact with the bottom surface of the recess on the tray, and accordingly, even though the holder is lowered in a condition in which no IC exist in the recess on the tray, the suction pad is prevented from making contact with the tray, thereby the suction pad is prevented from making contact with the bottom surface of the recess on the tray.

Thus, the suction pad is prevented from sucking the tray, thereby it is possible to eliminate a defect such as erroneous recognition caused due to suck-up of the tray by the suction pad.

As a result, it is possible to enhance the operational availability of the horizontal conveyer type automatic handler incorporating the IC suction mechanism.

Further, since the pressure sensor for detecting a high and a lower pneumatic pressure in the suction passage for the vacuum pump is provided, the presence of the IC in the recess on the tray can be detected.

The entire disclosure of Japanese Patent Application No. Tokugan hei-10-291035 filed on Oct. 13, 1998 including specification, claims, drawings and summary are incorporated herein by reference in its entirety.

What is claimed is:

1. A suction system comprising:
    a suction mechanism for an IC, in which a hollow shaft incorporating a suction pad at its lower end part, is supported by a holder so as to be vertically slidable, and the suction pad contacts an IC accommodated in a recess on a tray when the holder is lowered;
    a stopper having a step part projected downward so as to laterally cover the suction pad, the stopper is attached to the lower end part of the hollow shaft,
    a lower end of the step part is located above an IC contact surface of the suction pad,
    a lower surface of the stopper has at least a width which prevents the stopper from sinking into the recess on the tray, and
    a distance between the lower surface of the stopper to the IC contact surface of the suction pad is shorter than the depth of the recess on the tray.

2. A suction system as claimed in claim 1, wherein the suction mechanism further comprises:
    a suction means for sucking up an IC toward the suction pad in such a condition that the IC is contacted with the suction pad;
    a pressure sensor for detecting a high or lower degree of pneumatic pressure in a suction passage in the suction means, and
    an IC detecting means for detecting the presence of an IC in the recess on the tray in response to the pressure sensor.

3. A suction system as claimed in claim 1, wherein the suction mechanism successively shifts and releases the ICs into an IC conveyer therefrom.

4. A suction system comprising:
    a suction mechanism for an IC including a hollow shaft and a suction pad supported at a lower end part of the hollow shaft, the hollow shaft being supported by a holder so as to be vertically slidable, and the suction pad contacts an IC accommodated in a recess on a tray when the holder is lowered;
    the suction mechanism further including a stopper having a step part projected downward so as to laterally cover the suction pad, the step part is attached to the lower end part of the hollow shaft;
    the suction pad contacts the IC while the lower surface of the stopper does not contact the upper surface of the tray when the holder is lowered and an IC exists in the recess on the tray; and the lower surface of the stopper contacts the upper surface of the tray so that a gap is defined between the suction pad and the bottom surface of the recess on the tray when the holder is lowered when no IC exists in the recess.

5. A suction system as claimed in claim 4, wherein the suction mechanism further comprises:
    a suction means for sucking up an IC toward the suction pad such that the IC contacts the suction pad;
    a pressure sensor for detecting a high or lower degree of pneumatic pressure in a suction passage in the suction means; and
    an IC detecting means for detecting the presence of an IC in the recess on the tray in response to the pressure sensor.

6. A suction system as claimed in claim 4, wherein the suction mechanism successively shifts and releases the ICs into an IC conveyer therefrom.

7. A suction system comprising:
    a suction mechanism for an IC including a hollow shaft having a suction pad at its lower end part, the suction mechanism being supported by a holder so as to be vertically slidable such that the suction pad contacts an IC accommodated in a recess on a tray when the holder is lowered;
    wherein the hollow shaft further having a stopper for contacting an upper end face of the tray so as to stop downward motion of the hollow shaft when the holder is lowered when no IC exists in the recess on the tray, preventing the suction pad from contacting with the bottom surface of the recess on the tray.

8. A suction system as claimed in claim 7, wherein the suction mechanism further comprises:
    a suction means for sucking up an IC toward the suction pad such that the IC contacts the suction pad;
    a pressure sensor for detecting a high or lower degree of pneumatic pressure in a suction passage in the suction means; and
    an IC detecting means for detecting the presence of an IC in the recess on the tray in response to the pressure sensor.

9. A suction system as claimed in claim 7, wherein the suction mechanism successively shifts and releases the ICs into an IC conveyer therefrom.

10. A horizontally conveyer type automatic hander having a suction system comprising:
   a suction mechanism for an IC including a hollow shaft and a suction pad supported at a lower end part of the hollow shaft, the hollow shaft being supported by a holder so as to be vertically slidable, and the suction pad contacts an IC accommodated in a recess on a tray when the holder is lowered; and
   the suction mechanism further including a stopper having a step part projected downward so as to laterally cover the suction pad, the step part is attached to the lower end part of the hollow shaft;
   wherein the lower end of the step part is located above an IC contact surface of the suction pad, the lower surface of the stopper has a width which prevents the stopper from sinking into the recess on the tray, and a distance between the lower surface of the stopper to the IC contact surface of the suction pad is shorter than the depth of the recess on the tray.

11. A horizontally conveyer type automatic handler as claimed in claim 10, wherein the suction mechanism successively shifts and releases the ICs into an IC conveyer therefrom.

12. A horizontally conveyer type automatic handler having a suction system comprising:
   a suction mechanism for an IC including a hollow shaft incorporating a suction pad at a lower end part of the hollow shaft, the suction mechanism being supported by a holder so as to be vertically slidable, and the suction pad contacts an IC accommodated in a recess an a tray when the holder is lowered;
   wherein the suction mechanism includes a stopper having a step part projected downward so as to laterally cover the suction pad; the stopper is attached to the lower end part of the hollow shaft;
   whereby when the suction pad contacts the IC, the lower surface of the stopper does not contact the upper surface of the tray when the holder is lowered when an IC exists in the recess on the tray, and when the lower surface of the stopper contacts the upper surface of the tray, a gap is defined between the suction pad and the bottom surface of the recess on the tray when the holder is lowered and no IC exists in the recess.

13. A horizontally conveyer type automatic handler as claimed in claim 12, wherein the suction mechanism successively shifts and releases the ICs into an IC conveyer therefrom.

14. A horizontally conveyer type automatic handler having a suction system comprising:
   a suction mechanism for an IC, including a hollow shaft incorporating a suction pad at a lower end part of the hollow shaft, the suction mechanism is supported by a holder so as to be vertically slidable, and the suction pad contacts an IC accommodated in a recess on a tray when the holder is lowered;
   wherein the hollow shaft is attached to a stopper for contacting an upper end face of the tray so as to stop downward motion of the hollow shaft when the holder is lowered when no IC exists in the recess on the tray, preventing the suction pad from contacting the bottom surface of the recess on the tray.

15. A horizontally conveyer type automatic handler as claimed in claim 14, wherein the suction mechanism successively shifts and releases the ICs into an IC conveyer therefrom.

16. A method for sucking up an IC accommodated in a recess on a tray, with a suction system comprising:
   a suction mechanism for an IC, in which a hollow shaft incorporating a suction pad at its lower end part, is supported by a holder so as to be vertically slidable, and the suction pad contacts an IC accommodated in a recess on a tray when the holder is lowered; a stopper having a step part projected downward so as to laterally cover the suction pad, the stopper is attached to the lower end part of the hollow shaft; a lower end of the step part is located above an IC contact surface of the suction pad; a lower surface of the stopper has at least a width which prevents the stopper from sinking into the recess on the tray; and a distance between the lower surface of the stopper to the IC contact surface of the suction pad is shorter than the depth of the recess on the tray; the method comprising:
   descending the hollow shaft bringing the suction pad into contact with an IC accommodated in the recess when the IC exists in the recess:
   sucking up an IC accommodated in the recess by vacuum via the suction pad; and
   preventing the suction pad from contacting a bottom surface of the recess of the tray by a portion of the hollow shaft being brought into contact with an upper surface of the tray when no IC exists in the recess.

17. A method for sucking up an IC accommodated in a recess on a tray, with a suction system comprising:
   a suction mechanism for an IC including a hollow shaft and a suction pad supported at a lower end part of the hollow shaft, the hollow shaft being supported by a holder so as to be vertically slidable, and the suction pad contacts an IC accommodated in a recess on a tray when the holder is lowered; the suction mechanism further including a stopper having a step part projected downward so as to laterally cover the suction pad, the step part is attached to the lower end part of the hollow shaft; the suction pad contacts the IC while the lower surface of the stopper does not contact the upper surface of the tray when the holder is lowered and an IC exists in the recess on the tray; and the lower surface of the stopper contacts the upper surface of the tray so that a gap is defined between the suction pad and the bottom surface of the recess on the tray when the holder is lowered when no IC exist in the recess; the method comprising:
   descending the hollow shaft bringing the suction pad into contact with an IC accommodated in the recess when the IC exists in the recess;
   sucking up the IC accommodated in the recess by vacuum via the suction pad; and
   preventing the suction pad from contacting a bottom surface of the recess of the tray by a portion of the hollow shaft being brought into contact with an upper surface of the tray when no IC exists in the recess.

18. A method for sucking up an IC accommodated in a recess on a tray, with a suction system comprising:
   a suction mechanism for an IC including a hollow shaft having a suction pad at its lower end part, the suction mechanism being supported by a holder so as to be vertically slidable such that the suction pad contacts an IC accommodated in a recess on a tray when the holder is lowered; wherein the hollow shaft further having a stopper for contacting an upper end face of the tray so as to stop downward motion of the hollow shaft when the holder is lowered when no IC exists in the recess on the tray, preventing the suction pad from contacting with the bottom surface of the recess on the tray; the method comprising:

descending the hollow shaft bringing the suction pad into contact with an IC accommodated in the recess when the IC exists in the recess;

sucking up the IC accommodated in the recess by vacuum via the suction pad; and preventing the suction pad from contacting a bottom surface of the recess of the tray by a portion of the hollow shaft being brought into contact with an upper surface of the tray when no IC exists in the recess.

* * * * *